United States Patent
Jang

[19]

[11] Patent Number: 6,071,814
[45] Date of Patent: Jun. 6, 2000

[54] SELECTIVE ELECTROPLATING OF COPPER FOR DAMASCENE PROCESS

[75] Inventor: Syun-Ming Jang, Hsin-Chu, Taiwan

[73] Assignee: Taiwan Semiconductor Manufacturing Company, Hsin-Chu, Taiwan

[21] Appl. No.: 09/161,566

[22] Filed: Sep. 28, 1998

[51] Int. Cl.[7] .............................. H01L 21/44; C25D 5/02; C25D 5/52
[52] U.S. Cl. .......................... 438/687; 438/654; 438/672; 205/123; 205/222
[58] Field of Search ................................... 205/123, 222; 216/88, 89; 438/687, 629, 640, 654, 672

[56] References Cited

U.S. PATENT DOCUMENTS

| | | | |
|---|---|---|---|
| 4,981,715 | 1/1991 | Hirsch et al. | 427/53.1 |
| 5,055,425 | 10/1991 | Leibovitz et al. | 437/195 |
| 5,183,795 | 2/1993 | Ting et al. | 437/230 |
| 5,262,354 | 11/1993 | Cote et al. | 437/195 |
| 5,595,937 | 1/1997 | Mikagi | 437/192 |
| 5,933,758 | 8/1999 | Jain | 438/687 |

OTHER PUBLICATIONS

Dubin et al. "Selective Electroless Ni Deposition on a TiW Underlayer for Integrated Circuit Fabrication" Thin Solid Films. 226(1993) p87–93.

Chang et al. ULSI Technology, The McGraw–Hill Companies, Inc. 1997. p444–445.

*Primary Examiner*—Kathryn Gorgos
*Assistant Examiner*—Thao Tran
*Attorney, Agent, or Firm*—George O. Saile; Stephen B. Ackerman; William J. Stoffel

[57] ABSTRACT

A method of removing a seed layer 30 from areas over an insulting layer 20 where metal lines and pads will not be formed so that electroplated metal 50 can be chemical-mechanical polished without metal residue problems 151 and dishing problems. A key step of the invention is the patterning of the seed layer 30 to remove areas 40 of seed layer 30 that are not near the trenches 24. The method is as follows. An insulating layer 20 is formed having a plurality of trenches 24. A seed layer 30 is formed over the insulating layer 24. The seed layer 30 is comprised of a trench seed layer 30B and a top seed layer 30A on the top surface of the first insulating layer. We pattern the top seed layer 30A by removing selected portions of the top seed layer 30A to form a seed layer "lip" 30C around the trenches 24 so that the remaining seed layer 30B 30C electrically connects the trench seed layers 30B in the plurality of trenches 24. Metal is plated on the trench seed layer 30B filling the trenches 24. Next, the metal 50 and the seed layer lip 30C are chemical-mechanical polished to remove the seed layer lip 30C and form a metal line pattern 50 filling the trenches 24.

12 Claims, 3 Drawing Sheets

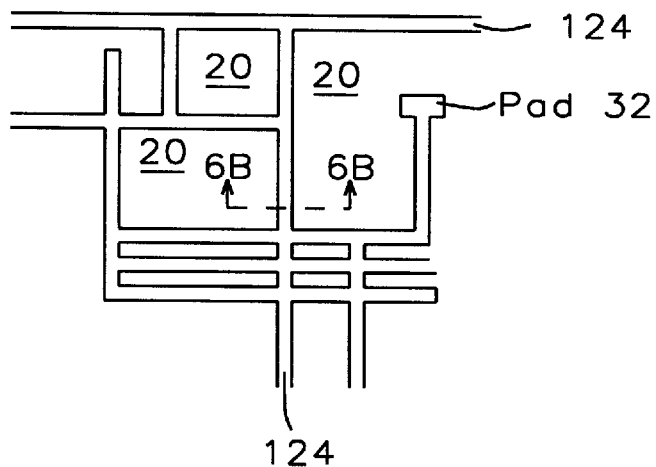
*FIG. 6A – Prior Art*
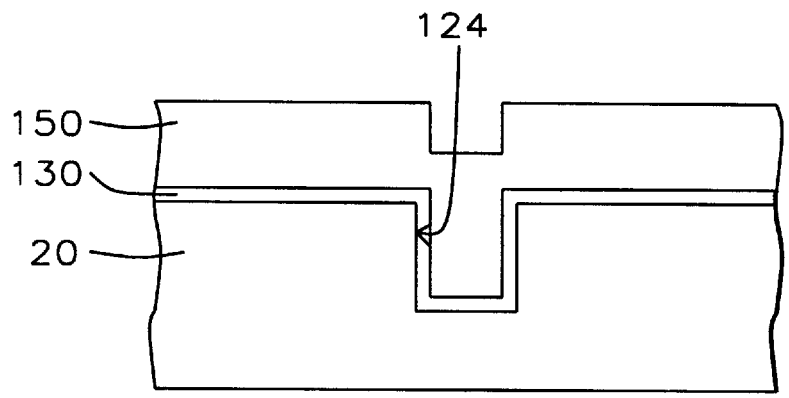
*FIG. 6B – Prior Art*
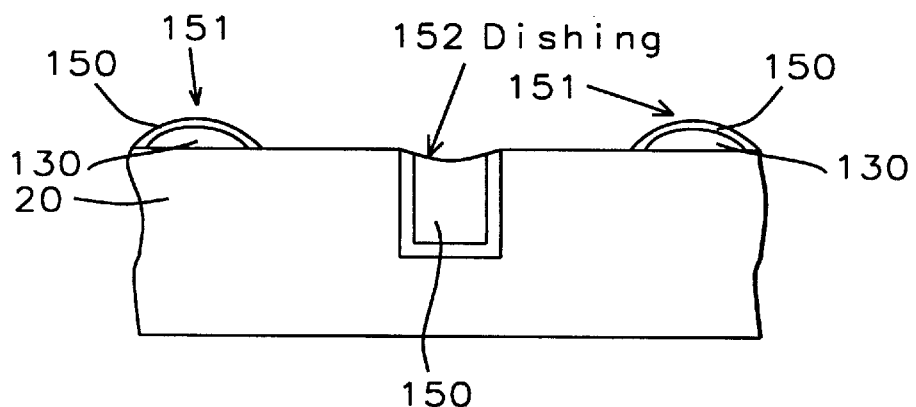
*FIG. 6C – Prior Art*

6,071,814

SELECTIVE ELECTROPLATING OF COPPER FOR DAMASCENE PROCESS

BACKGROUND OF INVENTION

1) Field of the Invention

This invention relates generally to fabrication of in laid metal lines for semiconductor devices and more particularly to a method for patterning a seed layer that is used to selectively deposit metal in a damascene or dual damascene process.

2) Description of the Prior Art

Low resistivity metal such as aluminum and copper and their binary and ternary alloys have been widely explored as fine line interconnects in semiconductor manufacturing. Typical examples of fine line interconnect metal include $Al_xCu_y$, ternary alloys Al—Pd—Cu, and Al—Pd—Nb and Al—Cu—Si and other similarly low resistivity metal based alloys. Emphasis on scaling down line width dimensions in very large scale integrated (VLSI) circuitry manufacture has led to reliability problems including inadequate isolating, electromigration, and planarization.

Damascene processes using metal filling vias and lines followed by chemical-mechanical polish (CMP) with various Al, Cu, and Cu-based alloys are a key element of wiring technologies for very large-scale system integration. Damascene and dual damascene processes are described C. Y. Chang, S. M. Sze, in *ULSI Technology*, by The McGraw-Hill Company, INC. copyright 1997, pp. 444–445.

A key part of the invention is the inventor's recognition of new problems—dishing 152 and residue 151 with electroplated line processes. See FIG. 6C. As the inventor's damascene and dual damascene processes have been implemented with soft metals (e.g., metals such as Al—Cu, Cu, alloys of Al, etc.) the inventor have found that the CMP process has caused a dishing problem 152 in the top surface of the metal lines. That is the CMP process removed more material in the center of the metal lines that at the edges thus causing an indentation or dishing problem. Preventing this dishing and completely removing Cu on oxide are the main object of this invention. Note that Cu on large areas of oxide are difficult to remove using chemical-mechanical polish (CMP).

FIG. 6A shows a top down view of a integrated circuit. FIGS. 6B and 6C are cross sectional views along axis 6B in FIG. 6A. Trenches 124 are formed in the insulating layer 20. The metal line patterns 150 are formed in the trenches 124. A seed/barrier layer 130 is formed on all of the top surface of the insulating layer 20. A metal layer 150 is deposited on the seed/barrier layer 130 preferably using an electro plating method. As shown in FIG. 6C, the inventor has found that when the metal layer 150 and seed/barrier layer 130 is chemical-mechanical polished, dishing 152 occurs. This dishing is worse over large pad areas 32. Also, the inventor has found that metal 150 and seed layer 130 form residues 151 in areas 151 (large areas of oxide) after the CMP as shown in FIG. 6C.

Therefore new methods are needed to overcome this dishing problem and residue problem.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,183,795 (Ting) shows a method for electroless of Copper on the bottom of a trench. However, the patent does not show the seed layer on the sidewalls of the damascene trench.

U.S. Pat. No. 5,055,425 (Leibovitz) Stacked solid via formation in integrated circuit systems—shows a Cu electroplating process.

U.S. Pat. No. 4,981,715 (Hirsch) Method of patterning electroless plated metal on a polymer substrate—discloses a method for patterning electroless plated metal. A substrate is first coated with a polymer suitable for complexing noble metal compounds. The substrate is then complexed with a noble metal compound, such as containing palladium, selectively irradiated to form the desired conductor pattern, and then etched so that the desired pattern remains. The substrate is subsequently placed in an electroless plating bath to form a metal pattern.

U.S. Pat. No. 5,262,354 (Cote) shows an interconnect process whereby the top metal layer is CMPed.

U.S. Pat. No. 5,595,937 (Mikagi) shows a method of forming Cu interconnect by MOCVD.

Dubin, *Selective Electroless Ni Deposition On A TiW Underlayer For Integrated Circuit Fabrication*, Thin Solid Films, 226 (1993) pp. 87 to 93, shows a method of forming a seed layer on the trench bottom and sidewalls using a PR process.

SUMMARY OF THE INVENTION

It is a object of the present invention to provide a method for removing by chemical-mechanical polish (CMP) unwanted metal (e.g., Cu) over large widths of insulating layer (e.g., oxide) by controlling the areas of the barrier/seed layer used to deposit the metal layers.

It is an object of the present invention to provide a method planarizing metal lines in a semiconductor device.

It is an object of the present invention to provide a method for electroplating or chemical vapor depositing metal lines and chemical-mechanical polishing the metal lines.

It is an object of the present invention to provide a damascene or dual damascene method for electroplating metal lines and chemical-mechanical polishing the metal lines that prevents dishing.

To accomplish the above objectives, the present invention provides method to fabricate in laid metal lines in interlevel dielectric (ILD) layers. The method patterns a seed layer 30 that is used to selectively deposit metal 50 in a damascene or dual damascene process. The method patterns the seed layer 30 so that electro plated metal 50 can be chemical-mechanical polished without dishing problems. The barrier metal and seed layer are etched off certain field areas which are independent of each other. The barrier metal/seed layer is retained between metal lines and chips for electroplating. In other words, no metal line or chip is isolated from one other. Therefore, the metal lines and chips are electrically connected for the purpose of flowing a current during the electroplating process for the metal layer 50.

A key step of the invention is the patterning/etching of the seed layer/barrier layer 30 to form a seed layer "lip" 30C that is adjacent to the trenches 24 in the insulating layer. The seed layer lip 30C is important because it prevents etching of the seed layer in the trench 24. This patterning removes areas 40 of seed layer 30 that are not near the trenches 24 being filled. Then metal is only electroplated on the seed layer 30B in the trenches and adjacent to the trenches 30C on the seed layer lip (30C). When the electroplated metal layer 50 is chemical-mechanical polished, dishing is prevented because metal 50 is only plated on the seed layer 30B 30C which in adjacent the trenches 24. That is, areas 40 of metal 50 some distance from the metal lines is removed. See FIG. 3.

Another key feature of the seed patterning step is that portions of the seed layer 30 are left so that all the seed layers (and therefore metal lines) are electrically connected together. This allows a contact to the seed layer furnish the electric voltage necessary to electro plate metal onto all seed layer surfaces.

The method of the invention can be summarized as follows:
a) See FIG. 1—We provide an insulating layer 20 over a semiconductor structure (12). The insulating layer 20 having a plurality of trenches 24; the plurality of trenches 24 defined by sidewalls and a bottom; the insulating layer 20 having a top surface.
b) A seed layer 30 is formed over the insulating layer 24, over the sidewalls and the bottom; the seed layer 30 comprised of a trench seed layer 30B covering the sidewalls and the bottom; and a top seed layer 30A on the top surface of the first insulating layer;
c) See FIGS. 2 & 3—In the key step, we pattern the top seed layer 30A by removing selected portions of the top seed layer 30A to form a seed layer "lip" 30C so that the remaining seed layer 30B 30C electrically connects the trench seed layers 30B in the plurality of trenches 24. The seed layer "lip" preferably has a width in a range of between about 0.2 and 0.4 $\mu$m depending of the photo. The smaller the lip the better. The seed layer is retained between metal lines and chips for electroplating. In other words, no metal line or chip is isolated from the others.
d) See FIG. 4—We plate a metal on the trench seed layer 30B filling the trenches 24 and on the top seed layer.
e) See FIG. 5—Next, the metal 50 and the seed layer lip 30C are chemical-mechanical polished to remove the seed layer lip 30C and form a metal line pattern 50 filling the trenches 24.

BENEFITS

The invention provides the following benefits:
The CMP process is faster and easier because the field areas 40 are not covered with metal 50.
The remaining metal on the insulating layer (on the seed layer lip 30c) can be polished off faster which improves CMP throughput and eliminates dishing.
The patterning of the seed layer allows a contact to the seed layer furnish the electric voltage necessary to electro plate metal onto all seed layer surfaces. That is portions of the seed layer 30 (seed layer lip 30C) are left so that all the parts of the seed layers in the trenches 24 across the wafer (and therefore metal lines) are electrically connected together.
The seed layer lip 30C also prevents dishing of the metal 50 in the trenches 24 during the subsequent chemical-mechanical polish.

The present invention achieves these benefits in the context of known process technology. However, a further understanding of the nature and advantages of the present invention may be realized by reference to the latter portions of the specification and attached drawings.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 6A is a top plan view for illustrating a conventional method for forming a seed layer over a substrate according to the prior art invention.

FIG. 6B is a cross sectional view along axis 6B in FIG. 6A showing the trench 124, seed layer 130 and newly deposited metal layer 150.

FIG. 6C is a cross sectional view along axis 6B in FIG. 6A showing the trench 124, seed layer 130 and metal layer 150 having a dishing problem 152 after chemical-mechanical polishing.

DETAILED DESCRIPTION OF THE PREFERRED EMBODIMENTS

The present invention will be described in detail with reference to the accompanying drawings. The present invention provides method to fabricate in laid metal lines in interlevel dielectric (ILD) layers. The method patterns a seed layer 30 that is used to selectively deposit metal 50 in a damascene or dual damascene process. The method patterns the seed layer 30 so that electro plated metal 50 can be chemical-mechanical polished without dishing problems.

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well know process have not be described in detail in order to not unnecessarily obscure the present invention.

It should be recognized that many publications describe the details of common techniques used in the fabrication process of integrated circuit components. See, E.g., C. Y. Chang, S. M. Sze, in *ULSI Technology*, by The McGraw-Hill Company, Inc. copyright 1997, pp. 444–445. Those techniques can be generally employed in the fabrication of the structure of the present invention. Moreover, the individual steps of such a process can be performed using commercially available integrated circuit fabrication machines. As specifically necessary to than understanding of the present invention, exemplary technical data are set forth based upon current technology. Future developments in the art may call for appropriate adjustments as would be obvious to one skilled in the art.

The term "substrate surface" is meant to include the upper most exposed layers on a semiconductor wafer, such as a silicon surface, an insulating layer and metallurgy lines.

Figure 1:
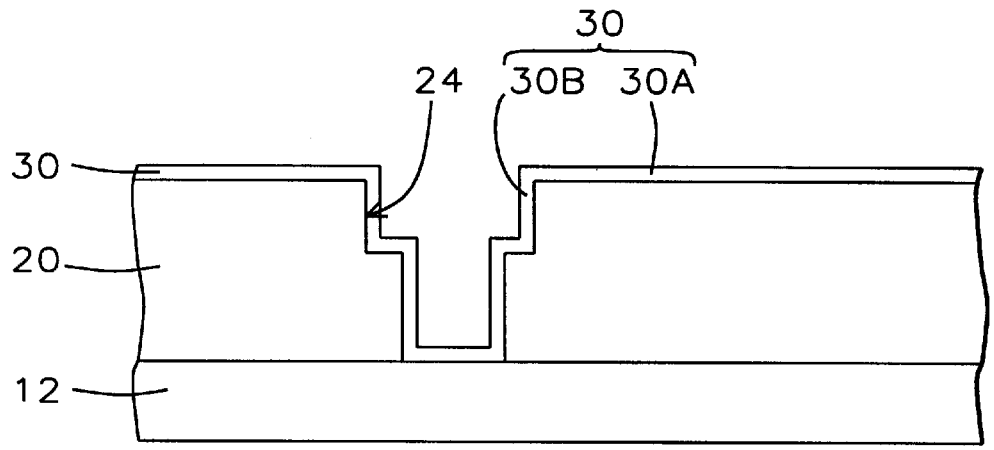
FIGS. 1, 2, 4, and 5 are cross sectional views for illustrating a method for forming patterning a seed layer so that dishing in a subsequently deposited metal layer is prevented according to the present invention.

As shown in FIG. 1, we provide an insulating layer 20 over a semiconductor structure (12). The insulating layer is preferably formed of oxide. The insulating layer 20 has a plurality of trenches 24 where metal lines and interconnects will be formed. The plurality of trenches 24 defined by sidewalls and a bottom. The insulating layer 20 has a top surface 30B.

The semiconductor structure 12 is understood to possibly include a semiconductor wafer, active and passive devices formed within the wafer and layers formed on the wafer surface.

Figure 2:
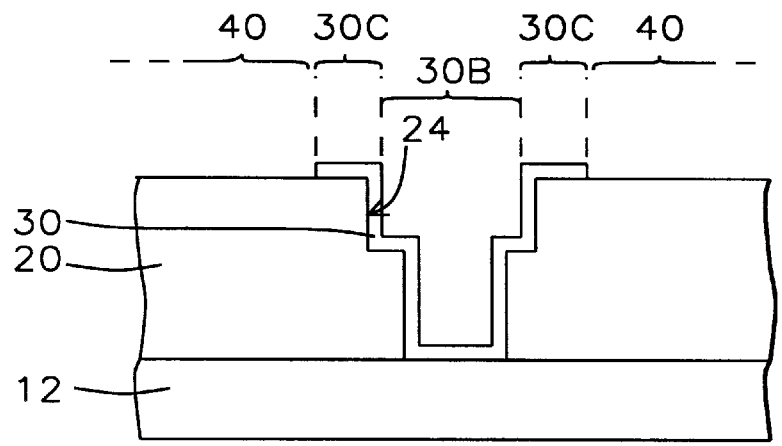

The trenches 24 can have any shape, such as rectangular (e.g., see FIG. 6B) or T shaped (e.g., as formed by dual damascene processes—see FIG. 2). The trenches 24 preferably have width (at the top of the trench) in a range of between about 0.3 and 1.0 μm. The inventor has found that trenches/pad area with a width greater than about 100 μm have dishing problems using conventional processes. Preferably, the trenches 24 are formed by a dual damascene process. Trenches with dual damascene shapes are filled with metal to form interconnects between metal layers.

Next, a seed layer 30 (seed and/or barrier layer) is formed over the insulating layer 24, over the sidewalls and the bottom. The seed layer can be comprised of two or more layers (e.g., an underlying barrier layer and an overlying seed layer). To better describe the configuration, the seed layer 30 is describe as being comprised of a "trench seed layer" 30B (e.g., seed layer in the trenches) covering the sidewalls and the bottom of the trench 24, and a top seed layer 30A on the top surface of the first insulating layer. The seed layer 30 can function as a barrier layer. The seed layer is preferably composed of Cu by Physical vapor deposition (PVD) or chemical vapor deposition with a thickness of between about 1000 and 2000 Å.

Figure 3A:
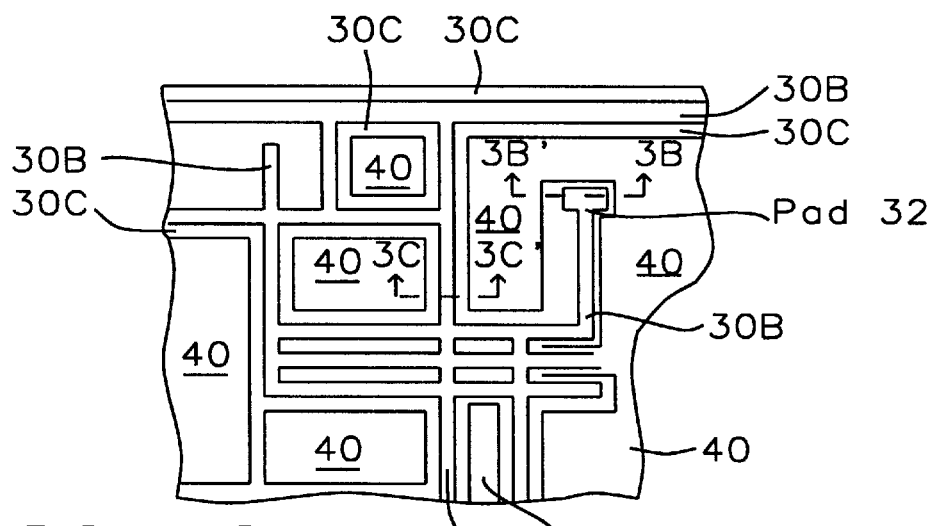
FIG. 3A is a top down view of the substrate showing the areas 40 where the top seed layer 30B was removed according to the present invention.
Figure 3B:
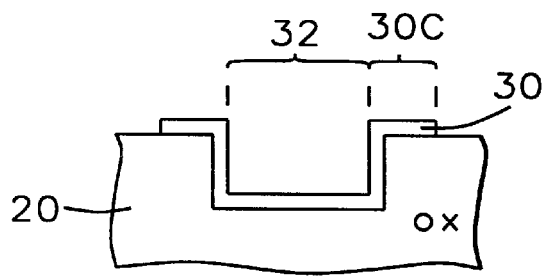
FIG. 3B is a cross sectional view along axis 3B/3B' in FIG. 3A.
Figure 3C:
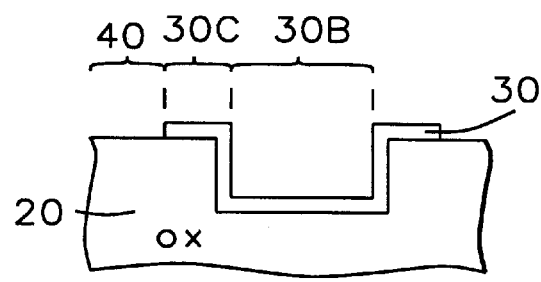
FIG. 3C is a cross sectional view along axis 3C/3C' in FIG. 3A.

FIGS. 2 & 3A show the key step of patterning the top seed layer 30A by removing selected portions 40 of the top seed layer 30A preferably so that the seed layer 30B 30C is electrically connected to seed layers 30B in the plurality of trenches 24. FIG. 3A shows a top down view.

The seed layer 30 is patterned so to form a "seed layer lip" 30C on the insulating layer 20 adjacent to the trench 124. The "seed layer lip" 30C preferably has a width in a range of between about 0.2 and 0.4 μm. The width of the "seed layer lip" 30C is preferably determined by the photolithography capabilities/tolerances. The lip prevents the seed layer in the trenches from being etched. Importantly, the lip also prevents dishing of the metal 50 in the trenches during the subsequent chemical-mechanical polish.

Top down FIG. 3A shows the portions of the seed layer 30C 30B is preferably retained between metal lines and chips for electroplating. In other words, no metal line or chip is isolated from the others. This allows electro plating on all the seed layer in all trenches 24 across the entire wafer. FIG. 3A shows the trenches 24, the seed layer lip 30C adjacent to the trenches 24 (and trench seed layer 30B). The field areas 40 are where the seed layer was removed. The invention removes as much of the seed/barrier layer on oxide (other than the layers within the trench). But we try not to require very narrow lip width so to reduce the photo precision required to etch the Lips 30C. As much of the seed layer over the insulating layer 20 is removed (other than the seed layer within the trenches). The seed layer is preferably removed over any non-trench areas with a width greater than 50 square μm or an area greater than 100 square μm. The invention has found that any seed layer left on non-trench areas leave metal residues after CMP.

The invention especially prevents dishing from occurring over pad areas 32.

Figure 4:
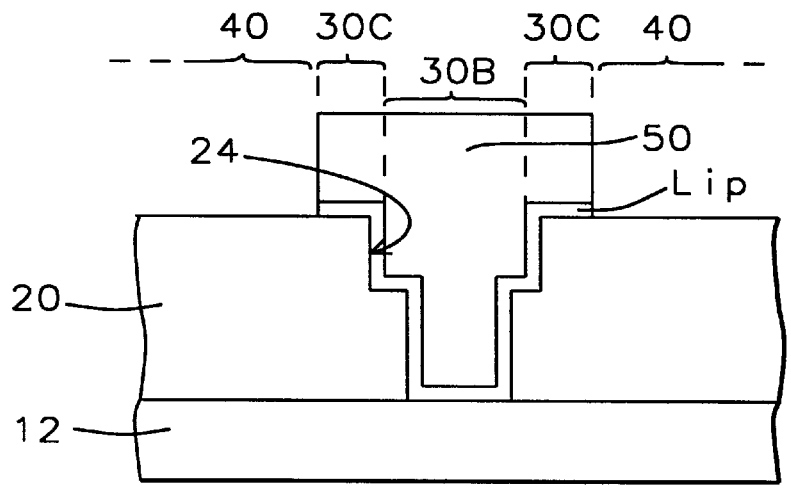

FIG. 4 shows the step of selectively electroplating a metal 50 on the trench seed layer 30B filling the trenches 24 and on the top seed layer lip 30C.

The metal 50 is deposited to have a height above the insulating layer in a range of between about 1.2 and 1.8 μm.

The plating of the metal is an electroplating process of a Cu, or Ni; and most preferably of Cu. Other electroless metal depositions or any other selective deposition processes can also be used.

Figure 5:
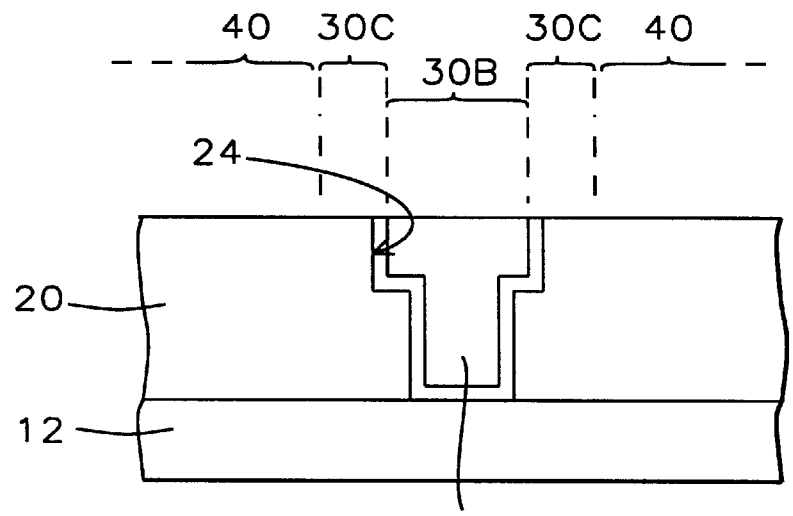

FIG. 5 shows the step of chemical-mechanical polishing the metal (CMP) 50 and the top seed layer 30A to remove the top seed layer lip 30c and form a metal line pattern 50 filling the trenches 24. The metal line pattern 50 preferably forms an interconnect layer. The removal of the seed layer 30 over the areas 40 eliminated the problem of the metal 50 residue remaining on the oxide 20 surfaces. The dishing problem is also eliminated because the metal is not over chemical-mechanical polished to removed the metal over the insulating layer.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of a metal line using a selective deposition process; comprising the steps of:
    a) providing an insulating layer over a semiconductor structure, said insulating layer having a plurality of trenches arranged in a predetermined pattern therein; each of said plurality of trenches being defined by sidewalls and a bottom; said insulating layer having a top surface;
    b) forming a seed layer over said insulating layer, said sidewalls, and said bottom of each of said plurality of trenches; said seed layer comprising a trench seed layer portion covering said sidewalls and bottoms of said plurality of trenches, and a top seed layer portion covering said insulating layer top surface;
    c) patterning said top seed layer portion of said seed layer by removing selected portions of said top seed layer portion forming seed layer lips adjacent said trench seed layer portion for each of said plurality of trenches; said seed layer lips and said trench seed layer portion electrically connecting said trench seed layer portion between said plurality of trenches;
    d) selectively depositing a metal on said patterned top seed layer, said seed layer lips, and said trench seed layer portion filling said plurality of trenches; and
    e) chemical-mechanically polishing said metal and said seed layer lips to remove the excess of said metal overlying said seed layer lips and said seed layer lips, forming a metal line pattern filling said plurality of trenches.

2. The method of claim 1 wherein said trenches have width in a range of between about 0.3 and 1.0 μm.

3. The method of claim 1 wherein said trenches formed by a dual damascene process.

4. The method of claim 1 wherein said seed layer is composed of Cu.

5. The method of claim 1 wherein the patterning of said top seed layer comprises removing said top seed layer from all areas over said insulating layer between said trenches and said seed layer lip.

6. The method of claim 1 wherein the patterning of said top seed layer comprises removing all areas of said top seed layer having a width greater than 50 μm.

7. The method of claim 1 wherein the patterning of said top seed layer comprises removing all areas of said top seed layer having a area greater than 100 square microns.

8. The method of claim 1 wherein said seed layer lip having a width in a range of between about 0.2 and 0.4 μm.

9. The method of claim 1 wherein the selective deposition of said metal is an electroplating of Cu forming metal lines in said trenches.

10. A method of fabrication of a metal line using a selective deposition process; comprising the steps of:

a) providing an insulating layer over a semiconductor structure, said insulating layer having a plurality of trenches arranged in a predetermined pattern therein; each of said plurality of trenches being defined by sidewalls and a bottom;

said insulating layer having a top surface; said trenches having an upper width of from about 0.3 to 1.0 μm;

b) forming a copper seed layer over said insulating layer, said sidewalls, and said bottom of each of said plurality of trenches; said copper seed layer comprising a trench copper seed layer portion covering said sidewalls and bottoms of said plurality of trenches, and a top copper seed layer portion covering said insulating layer top surface;

c) patterning said top copper seed layer portion of said copper seed layer by removing selected portions of said top copper seed layer portion forming copper seed layer lips adjacent said trench copper seed layer portion for each of said plurality of trenches; said copper seed layer lips and said trench copper seed layer portion electrically connecting said trench copper seed layer portion between said plurality of trenches; said copper seed layer lips having a width from about 0.2 and 0.4 μm;

d) selectively depositing copper on said patterned top copper seed layer, said copper seed layer lips, and said trench copper seed layer portion filling said plurality of trenches; said selective copper deposition being a selective copper electroplating; and e) chemical-mechanically polishing said copper and said copper seed layer lips to remove the excess of said copper overlying said copper seed layer lips and said seed layer lips, forming a copper line pattern filling said plurality of trenches.

11. The method of claim 10 wherein the patterning of said top seed layer comprises removing all areas of said top seed layer having a width greater than 50 μm.

12. The method of claim 10 wherein the patterning of said top seed layer comprises removing all areas of said top seed layer having a area greater than 100 square microns.

* * * * *